United States Patent
Katayama et al.

(10) Patent No.: US 12,178,024 B2
(45) Date of Patent: Dec. 24, 2024

(54) COOLING SYSTEM WITH FLOW RATE REGULATION

(71) Applicant: TOYOTA JIDOSHA KABUSHIKI KAISHA, Toyota (JP)

(72) Inventors: Masaaki Katayama, Tokyo (JP); Naoyuki Kishimoto, Susono (JP); Daisuke Tokozakura, Susono (JP); Satoshi Tominaga, Susono (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 409 days.

(21) Appl. No.: 17/675,601

(22) Filed: Feb. 18, 2022

(65) Prior Publication Data
US 2022/0295675 A1 Sep. 15, 2022

(30) Foreign Application Priority Data
Mar. 15, 2021 (JP) ................. 2021-041835

(51) Int. Cl.
| H05K 7/20 | (2006.01) |
| --- | --- |
| B60L 58/26 | (2019.01) |
| B60K 1/00 | (2006.01) |

(52) U.S. Cl.
CPC ......... *H05K 7/20945* (2013.01); *B60L 58/26* (2019.02); *H05K 7/20927* (2013.01); *B60K 2001/005* (2013.01); *B60K 2001/006* (2013.01)

(58) Field of Classification Search
CPC ............. B60K 11/02; B60K 2001/003; B60K 2001/005; B60K 2001/006; B60L 58/26; H05K 7/20927; H05K 7/20945
See application file for complete search history.

(56) References Cited

U.S. PATENT DOCUMENTS

| 2002/0127448 A1* | 9/2002 | Derflinger | ......... H01M 8/04029 |
| --- | --- | --- | --- |
| | | | 429/434 |
| 2019/0271258 A1* | 9/2019 | Mendez Abrego | ..... F01P 7/164 |

FOREIGN PATENT DOCUMENTS

| JP | 2010-277815 A | 12/2010 |
| --- | --- | --- |
| JP | 2013-256983 A | 12/2013 |
| JP | 2020-080611 A | 5/2020 |
| JP | 2021-037893 A | 3/2021 |

* cited by examiner

*Primary Examiner* — Jonathan Bradford
(74) *Attorney, Agent, or Firm* — Dinsmore & Shohl LLP

(57) ABSTRACT

A cooling system includes a first cooling passage in which a first cooling object is cooled by first coolant, a flow passage that supplies the first coolant to a second cooling object from the first cooling passage, a flow rate regulation mechanism that regulates a flow rate of the first coolant flowing in the first cooling passage, and a controller that controls the flow rate regulation mechanism. The controller controls the flow rate regulation mechanism so that the flow rate of the first coolant flowing in the first cooling passage is lower when temperature of the first cooling object is lower than temperature of the first coolant, than the flow rate when the temperature of the first cooling object is equal to or higher than the temperature of the first coolant.

9 Claims, 2 Drawing Sheets

COOLING SYSTEM WITH FLOW RATE REGULATION

CROSS-REFERENCE TO RELATED APPLICATION

This application claims priority to Japanese Patent Application No. 2021-041835 filed on Mar. 15, 2021, incorporated herein by reference in its entirety.

BACKGROUND

1. Technical Field

The disclosure relates to a cooling system.

2. Description of Related Art

Japanese Unexamined Patent Application Publication No. 2010-277815 (JP 2010-277815 A) discloses a technology by which a cooling system of a fuel cell and a cooling system of an electric drive system are combined, and coolant is circulated in both of the cooling systems by the same pump.

SUMMARY

In a cooling system in which a first cooling object and a second cooling object are cooled by common coolant, when temperature of the coolant after one of the first cooling object and the second cooling object is cooled is higher than temperature of the other cooling object, the coolant transfers its heat to the other cooling object even though the coolant was intended to cool the other object, and the temperature of the other cooling object may end up being higher.

The disclosure has been accomplished in light of the above problem, and an object thereof is to provide a cooling system in which a temperature increase of a first cooling object due to heat transfer from first coolant to the first cooling object is restrained.

In order to solve the above-described issue and attain the object, a cooling system according to the disclosure includes a first cooling passage in which a first cooling object is cooled by first coolant, a flow passage configured to supply the first coolant to a second cooling object from the first cooling passage, a flow rate regulation mechanism configured to regulate a flow rate of the first coolant flowing in the first cooling passage, and a controller configured to control the flow rate regulation mechanism. The controller controls the flow rate regulation mechanism so that the flow rate of the first coolant flowing in the first cooling passage is lower when temperature of the first cooling object is lower than temperature of the first coolant, than the flow rate of the first coolant when the temperature of the first cooling object is equal to or higher than the temperature of the first coolant.

Thus, a temperature increase of the first cooling object due to heat transfer from the first coolant to the first cooling object is restrained.

In the forgoing, the cooling system may include a bypass flow passage configured to allow the first coolant to bypass the first cooling passage and configured to supply the first coolant to the flow passage. The flow rate regulation mechanism may be able to perform selective switching between a first route and a second route. The first route supplies the first coolant to the first cooling passage, and the second route allows the first coolant to flow into the bypass flow passage and supplies the first coolant into the flow passage. The controller may control the flow rate regulation mechanism so as to switch to the first route when the temperature of the first cooling object is equal to or higher than the temperature of the first coolant, and to the second route when the temperature of the first cooling object is lower than the temperature of the first coolant.

Thus, it is possible to restrain the first coolant with temperature higher than that of the first cooling object from being supplied to the first cooling passage.

Also, in the foregoing, when the temperature of the first cooling object is equal to or higher than the temperature of the first coolant, the controller may control the flow rate regulation mechanism so as to reduce the flow rate of the first coolant flowing in the first cooling passage as the temperature of the first cooling object is lower.

Thus, it is possible to reduce a pressure drop.

Further, in the foregoing, the first cooling object and the second cooling object may generate heat as the first cooling object and the second cooling object are energized.

Thus, it is possible that the first cooling object and the second cooling object generating heat due to energization are effectively cooled with use of the common first coolant.

Further, in the foregoing, the second cooling object may be a rotating electrical machine, and the first cooling object may be a power control unit that controls the rotating electrical machine.

Thus, it is possible that the power control unit and the rotating electrical machine are effectively cooled with the common first coolant.

Further, in the foregoing, the first coolant may have insulation property.

Thus, the first coolant is able to be in direct contact with and cool the first cooling object and the second cooling object.

Further, in the foregoing, the cooling system may include a second cooling passage in which the first cooling object is cooled with second coolant.

Thus, it is possible to effectively cool the first cooling object with the first coolant and the second coolant.

The cooling system according to the disclosure has an effect of restraining a temperature increase in the first cooling object due to heat transfer from the first coolant to the first cooling object.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Hereinafter, an embodiment of a cooling system in a vehicle according to the disclosure is described. The disclosure is not limited to the embodiment. The cooling system in the vehicle according to the embodiment may be applied to, for example, a hybrid vehicle in which an internal combustion engine and a motor are provided as a power source for driving its driving wheels, and an electric vehicle such as an electric car in which a motor is provided as the power source.

Figure 1:
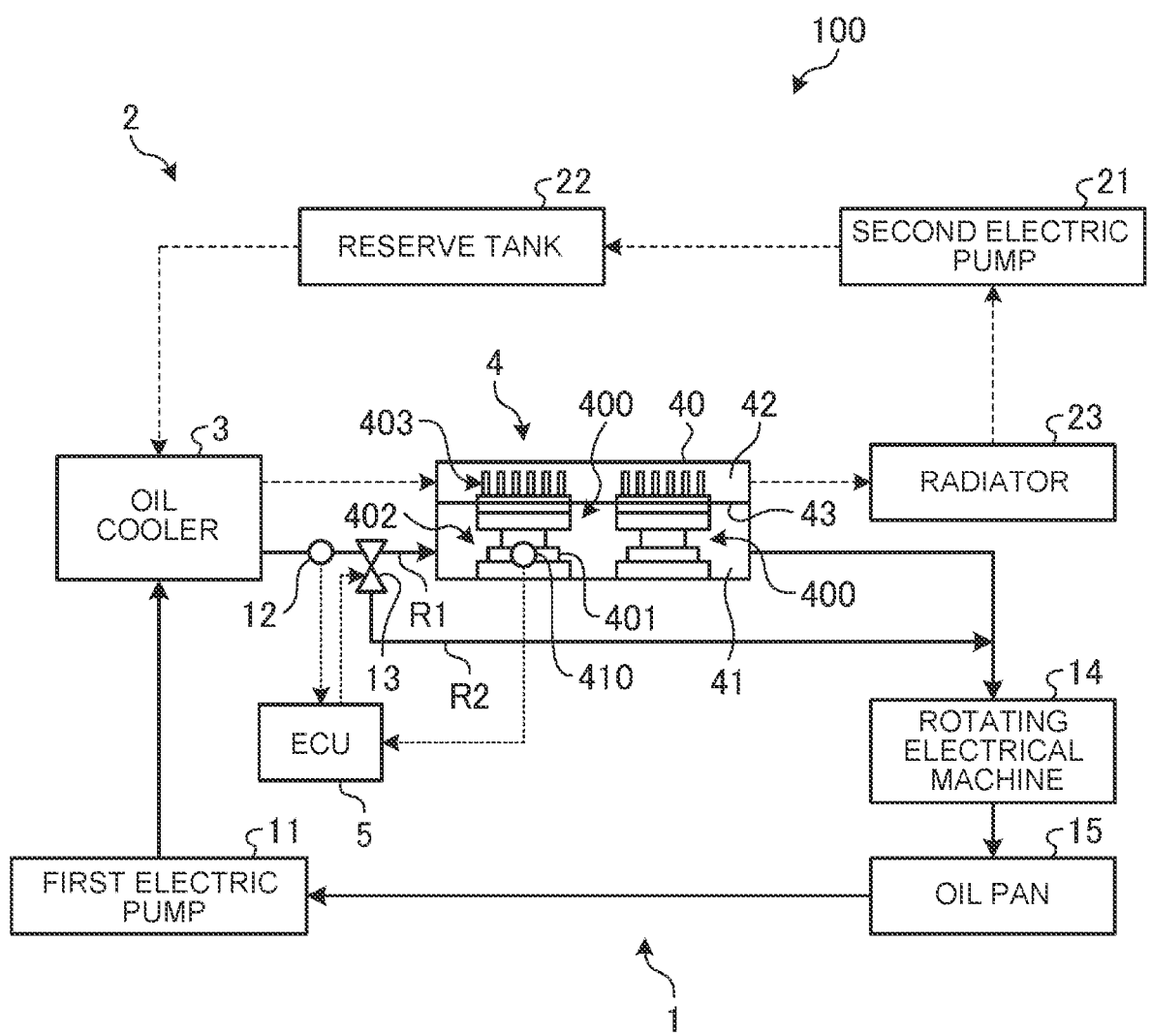
FIG. 1 is a schematic view of a structure of a cooling system in a vehicle according to an embodiment.

FIG. 1 is a schematic view of a structure of a cooling system 100 in a vehicle according to the embodiment. As shown in FIG. 1, the cooling system 100 in the vehicle according to the embodiment includes a first cooling circuit 1 and a second cooling circuit 2. In the first cooling circuit 1, first coolant circulates while cooling a power control unit (PCU) 4 that is a first cooling object, and a rotating electrical machine 14 that is a second cooling object. In the second cooling circuit 2, second coolant that cools the PCU 4 circulates. An insulating property of the first coolant is higher than that of the second coolant. For the first coolant, for example, liquid insulating coolant with volume resistivity of 10 Ωcm or higher and dielectric breakdown voltage of 10 kV or higher may be used. For the second coolant, for example, long life coolant (LLC) may be used.

In the first cooling circuit 1, a first electric pump 11, an oil cooler 3, a first temperature sensor 12, a switching valve 13, the PCU 4, the rotating electrical machine 14, and an oil pan 15 are arranged and connected with each other through piping. As the first electric pump 11 is operated, the first coolant circulates inside the first cooling circuit 1. Solid line arrows in FIG. 1 represent a route in which the first coolant flows in the first cooling circuit 1.

The switching valve 13 is a switching three-way valve, and selectively switches the route where the first coolant from the oil cooler 3 flows between a first route R1 and a second route (a bypass flow passage) R2. In the first route R1, the first coolant is supplied to the PCU 4 (a first cooling passage 41 described later). In the second route R2, the first coolant bypasses the PCU 4 (the first cooling passage 41) and is supplied to a flow passage (piping) that supplies the first coolant to the rotating electrical machine 14 from the PCU 4 (the first cooling passage 41). The switching operation of the switching valve 13 is performed with use of a driving mechanism such as an actuator controlled by an ECU 5 mounted on the vehicle.

When the route in the first cooling circuit 1 where the first coolant flows is switched to the first route R1 by the switching valve 13, and when it is assumed that the first electric pump 11 is a starting point, the first coolant circulates inside the first cooling circuit 1 in the order of the first electric pump 11, the oil cooler 3, the first temperature sensor 12, the switching valve 13, the PCU 4, the rotating electrical machine 14, and the oil pan 15. Meanwhile, when the route in the first cooling circuit 1 where the first coolant flows is switched to the second route (the bypass flow passage) R2 by the switching valve 13, and when it is assumed that the first electric pump 11 is a starting point, the first coolant circulates inside the first cooling circuit 1 in the order of the first electric pump 11, the oil cooler 3, the first temperature sensor 12, the switching valve 13, the rotating electrical machine 14, and the oil pan 15. As the route in which the first coolant flows in the first cooling circuit 1 is switched to the second route (the bypass flow passage) R2 by the switching valve 13, the first coolant does not flow in the PCU 4.

Also, in the first cooling circuit 1, the first temperature sensor 12 that detects temperature T1 of the first coolant is arranged in the piping between the oil cooler 3 and the switching valve 13.

In the second cooling circuit 2, a second electric pump 21, a reserve tank 22, the oil cooler 3, the PCU 4, and a radiator 23 are arranged and connected with each other by piping. The oil cooler 3 arranged in the second cooling circuit 2 is shared by the first cooling circuit 1, and it is possible to perform heat exchange between the first coolant and the second coolant in the oil cooler 3. In the second cooling circuit 2, as the second electric pump 21 is operated, when it is assumed that the second electric pump 21 is a starting point, the second coolant circulates in the order of the second electric pump 21, the reserve tank 22, the oil cooler 3, the PCU 4, and the radiator 23. Broken-line arrows in FIG. 1 represent a route in which the second coolant flows in the second cooling circuit 2.

The PCU 4 is constituted as a power card module 400 having a semiconductor element 401, and so on are arranged inside a case 40. The PCU 4 is driven by electric power of a battery mounted on the vehicle, and controls operations of the rotating electrical machine 14. The rotating electrical machine 14 follows a control signal from the PCU 4 and generates power that drives driving wheels of the vehicle with use of the electric power of the battery. The rotating electrical machine 14 is arranged, for example, below the PCU 4.

In the PCU 4, the power card module 400 includes a module body part 402 and a heat dissipation member 403. The module body part 402 is constituted as the semiconductor element 401 is sandwiched by heat transfer members or the like from above and below. The heat dissipation member 403 is provided on top of the module body part 402, and dissipates heat transferred from the semiconductor element 401 through the heat transfer members. Inside of the case 40 is divided by a partition wall 43 into the first cooling passage 41 and a second cooling passage 42 in the height direction of the power card module 400. In the first cooling passage 41, the module body part 402 is arranged, and the first coolant flows. In the second cooling passage 42, the heat dissipation member 403 is arranged, and the second coolant flows.

In the first cooling circuit 1, the first cooling passage 41 forms a flow passage in which the first coolant flows and cools the module body part 402 of the PCU 4. An upstream side of the first cooling passage 41 in the flow direction of the first coolant is connected with the switching valve 13 by piping which forms the first route R1. A downstream side of the first cooling passage 41 in the flow direction of the first coolant is connected with the rotating electrical machine 14 by piping. As the first electric pump 11 is operated, the first coolant after heat exchange with the second coolant is performed in the oil cooler 3 flows from the oil cooler 3 in the first route R1 and is sent to the first cooling passage 41 by the switching valve 13. The first coolant sent to the first cooling passage 41 flows inside the first cooling passage 41 so as to be in direct contact with the module body part 402. Thus, the first coolant cools the module body part 402 and then the semiconductor element 401. After the cooling of the module body part 402 is done, the first coolant is sent to the rotating electrical machine 14 from the first cooling passage 41 and cools the rotating electrical machine 14. After the cooling of the rotating electrical machine 14 is done, the first coolant is collected in the oil pan 15 provided below the rotating electrical machine 14, and then sent to the first electric pump 11 from the oil pan 15.

In the second cooling circuit 2, the second cooling passage 42 forms a flow passage where the second coolant flows and cools the heat dissipation member 403 of the PCU 4. An upstream side of the second cooling passage 42 in the flow direction of the second coolant is connected with the oil cooler 3 by piping, and a downstream side of the second cooling passage 42 in the flow direction of the second coolant is connected with the radiator 23 by piping. As the second electric pump 21 is operated, the second coolant stored in the reserve tank 22 is sent to the second cooling passage 42 after heat is exchanged with the first coolant in the oil cooler 3. The second coolant sent to the second cooling passage 42 flows inside the second cooling passage 42 so that the second coolant is in direct contact with the heat dissipation member 403. Thus, the second coolant cools the heat dissipation member 403 and then the semiconductor element 401. After the cooling of the heat dissipation member 403 is done, the second coolant is sent to the radiator 23 from the second cooling passage 42. Then, the second coolant is cooled in the radiator 23 as heat exchange is performed between the second coolant and outside air where heat of the second coolant moves to outside air. Then, the cooled second coolant is sent to the second electric pump 21.

Data from various sensors is input to the ECU 5. In the example shown in FIG. 1, the first temperature sensor 12 provided in the piping connecting the oil cooler 3 and the switching valve 13 in the first cooling circuit 1 measures temperature T1 of the first coolant before the first coolant is sent to the PCU 4 (the first cooling passage 41). The data of the measured temperature T1 of the first coolant is input to the ECU 5. A second temperature sensor 410 is installed in a portion of the PCU 4 where the second temperature sensor 410 is able to directly monitor if the semiconductor element 401 has reached heat resisting temperature, or a portion where the second temperature sensor 410 is able to indirectly estimate the same. The data of temperature T2 of the semiconductor element 401 is input to the ECU 5 from the second temperature sensor 410.

Then, in the cooling system 100 according to the embodiment, the ECU 5 causes the switching valve 13 to switch between the first route R1 and the second route (the bypass flow passage) R2 based on the temperature T1 of the first coolant and the temperature T2 of the semiconductor element 401.

Figure 2:
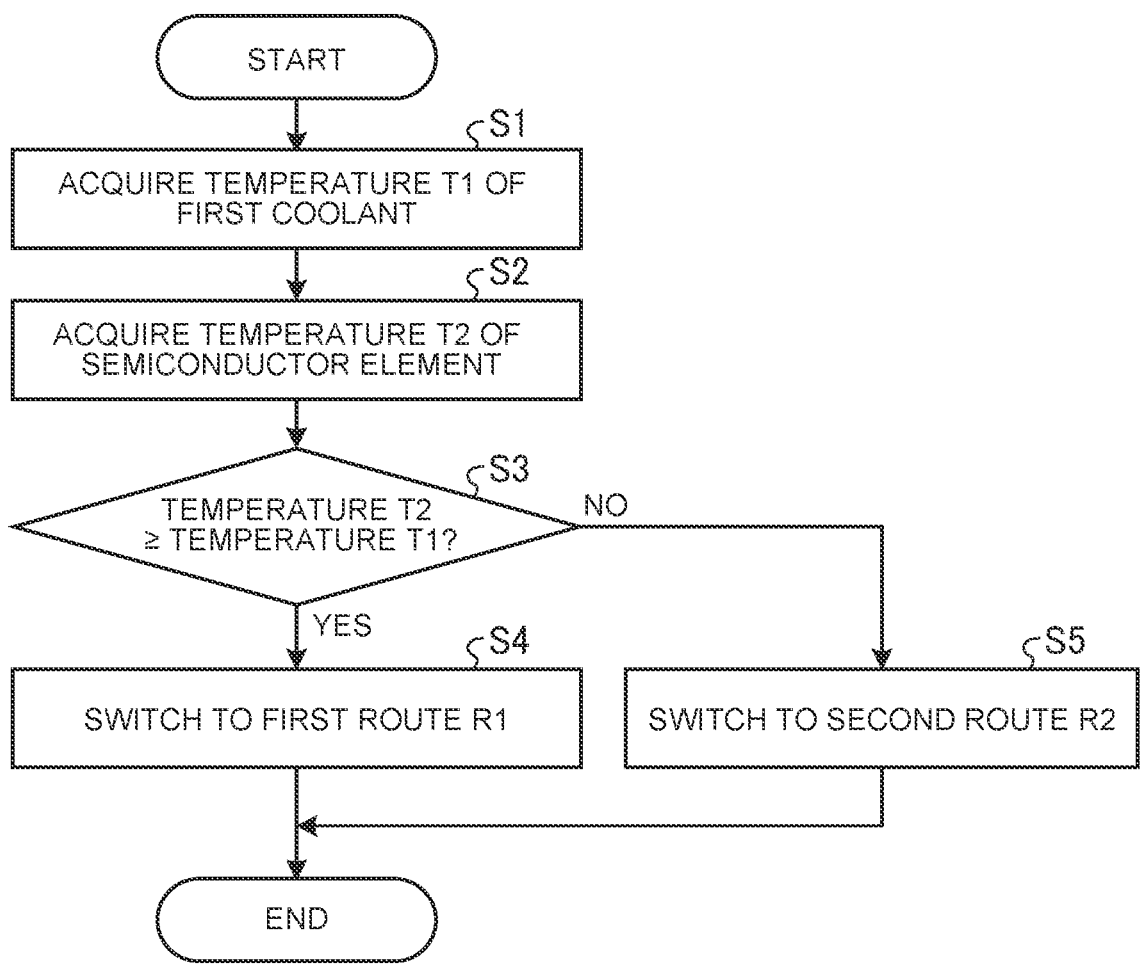
FIG. 2 is a flowchart showing an example of switching control for a switching valve conducted by an ECU.

FIG. 2 is a flowchart showing an example of the switching control of the switching valve 13 performed by the ECU 5.

First of all, in step S1, the ECU 5 acquires the temperature T1 of the first coolant from the first temperature sensor 12 provided in the piping that connects the oil cooler 3 and the switching valve 13 in the first cooling circuit 1. Next, in step S2, the ECU 5 acquires the temperature T2 of the semiconductor element 401 from the second temperature sensor 410 provided in the PCU 4 in the first cooling circuit 1. Next, in step S3, the ECU 5 determines whether or not a relationship of the temperature T2 of the semiconductor element 401≥the temperature T1 of the first coolant is satisfied.

When the ECU 5 determines that the relationship of the temperature T2 of the semiconductor element 401≥the temperature T1 of the first coolant is satisfied (Yes in step S3), the ECU 5 causes the switching valve 13 to switch the flow passage in which the first coolant flows to the first route R1 in step S4. Thus, the first coolant at temperature equal to or lower than the temperature T2 of the semiconductor element 401 is supplied to the first cooling passage 41 of the PCU 4. Thus, the first coolant is able to cool the semiconductor element 401. After the switching to the first route R1 by the switching valve 13 is finished, the ECU 5 ends the series of the switching control.

Meanwhile, when the ECU 5 determines that the relationship of the temperature T2 of the semiconductor element 401≥the temperature T1 of the first coolant is not satisfied, in other words, a relationship of the temperature T2 of the semiconductor element 401<the temperature T1 of the first coolant is satisfied (No in step S3), the ECU 5 causes the switching valve 13 to switch the flow passage in which the first coolant flows to the second route R2 in step S5. Thus, the first coolant with temperature higher than that of the semiconductor element 401 is not supplied to the first cooling passage 41. Instead, the first coolant flows in the second route R2 while bypassing the first cooling passage 41 of the PCU 4 and is supplied to the rotating electrical machine 14. Thus, it is possible to restrain an increase in the temperature T2 of the semiconductor element 401 caused by heat transfer from the first coolant with temperature higher than that of the semiconductor element 401 to the semiconductor element 401. After the switching to the second route R2 by the switching valve 13 is finished, the ECU 5 ends the series of the switching control.

In the cooling system 100 according to the embodiment, the temperature T1 of the first coolant and the temperature T2 of the semiconductor element 401 are not limited to temperature that is actually measured by the first temperature sensor 12 and the second temperature sensor 410, respectively. For example, in the cooling system 100 according to the embodiment, estimated temperature of the temperature T1 of the first coolant and the temperature T2 of the semiconductor element 401 estimated based on a driving state of the vehicle (the number of revolution and torque of the rotating electrical machine 14) with use of a map previously calculated in experiments or the like may be used.

Further, in the cooling system 100 according to the embodiment, the switching valve 13 functions as a flow rate regulation mechanism that regulates a flow rate of the first coolant flowing in the first cooling passage 41 of the PCU 4 as the switching valve 13 selectively switches the route in which the first coolant flows between the first route R1 and the second route R2. Meanwhile, in the cooling system 100 according to the embodiment, the ECU 5 may control opening of the switching valve 13 so that the flow rate of the first coolant flowing in the first cooling passage 41 of the PCU 4 is lower when the temperature T2 of the semiconductor element 401 is lower than the temperature T1 of the first coolant than the flow rate of the first coolant when the temperature T2 of the semiconductor element 401 is equal to or higher than the temperature T1 of the first coolant.

Also, when the ECU 5 controls the opening of the switching valve 13, the ECU 5 may control the opening of the switching valve 13 so that, when the temperature T2 of the semiconductor element 401 is equal to or higher than the temperature T1 of the first coolant, the flow rate of the first coolant flowing in the first cooling passage 41 of the PCU 4 is reduced as the temperature of the semiconductor element 401 is lower. Thus, it is possible to reduce a pressure drop.

What is claimed is:

1. A cooling system, comprising:
    a first cooling passage in which a first cooling object is cooled by first coolant;
    a flow passage configured to supply the first coolant to a second cooling object from the first cooling passage;
    a first coolant temperature sensor that measures a temperature of the first coolant;
    a first cooling object temperature sensor that measures a temperature of the first cooling object;
    a flow rate regulation mechanism that includes a switching valve and is configured to regulate a flow rate of the first coolant flowing in the first cooling passage; and
    a controller configured to control the flow rate regulation mechanism, wherein:
        the controller controls the flow rate regulation mechanism based on the temperature of the first coolant or the temperature of the first cooling object so that the flow rate of the first coolant flowing in the first cooling passage is lower when temperature of the first cooling object is lower than temperature of the first coolant, than the flow rate of the first coolant when the temperature of the first cooling object is equal to or higher than the temperature of the first coolant.

2. The cooling system according to claim 1, comprising a bypass flow passage configured to allow the first coolant to bypass the first cooling passage and configured to supply the first coolant to the flow passage, wherein:

the flow rate regulation mechanism is able to perform selective switching between a first route and a second route, the first route supplying the first coolant to the first cooling passage, and the second route allowing the first coolant to flow into the bypass flow passage and supplying the first coolant into the flow passage; and the controller controls the flow rate regulation mechanism so as to switch to the first route when the temperature of the first cooling object is equal to or higher than the temperature of the first coolant, and to the second route when the temperature of the first cooling object is lower than that the temperature of the first coolant.

3. The cooling system according to claim 1, wherein, when the temperature of the first cooling object is equal to or higher than the temperature of the first coolant, the controller controls the flow rate regulation mechanism so as to reduce the flow rate of the first coolant flowing in the first cooling passage as the temperature of the first cooling object is reduced.

4. The cooling system according to claim 1, wherein the first cooling object and the second cooling object generate heat as the first cooling object and the second cooling object are energized.

5. The cooling system according to claim 4, wherein:

the second cooling object is a rotating electrical machine; and the first cooling object is a power control unit that includes a semiconductor element and controls the rotating electrical machine.

6. The cooling system according to claim 1, wherein the first coolant has an insulating property.

7. The cooling system according to claim 1, comprising a second cooling passage in which the first cooling object is cooled by second coolant.

8. The cooling system according to claim 7, wherein the second cooling passage is independent of the first cooling passage.

9. The cooling system according to claim 7, wherein the first cooling object comprises a case having a partition wall that separates the first cooling passage and the second cooling passage.

* * * * *